United States Patent
Jo

(10) Patent No.: US 8,730,749 B2
(45) Date of Patent: May 20, 2014

(54) DATA TRANSMISSION CIRCUIT AND SEMICONDUCTOR APPARATUS USING THE SAME

(75) Inventor: Mi Hyeon Jo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 297 days.

(21) Appl. No.: 13/340,865

(22) Filed: Dec. 30, 2011

(65) Prior Publication Data

US 2013/0100753 A1     Apr. 25, 2013

(30) Foreign Application Priority Data

Oct. 20, 2011   (KR) .......................... 10-2011-0107636

(51) Int. Cl.
*G11C 7/02*       (2006.01)

(52) U.S. Cl.
USPC .......................................... 365/207; 365/205

(58) Field of Classification Search
USPC ...................... 365/207, 205, 230.06, 189.011
See application file for complete search history.

(56) References Cited

U.S. PATENT DOCUMENTS

| | | | | |
|---|---|---|---|---|
| 7,855,926 B2 * | 12/2010 | Shin et al. | ...................... | 365/190 |
| 8,213,250 B2 * | 7/2012 | Song | .............................. | 365/205 |
| 8,300,485 B2 * | 10/2012 | Lim et al. | ...................... | 365/207 |
| 2004/0085841 A1 * | 5/2004 | Lim et al. | ...................... | 365/203 |

\* cited by examiner

*Primary Examiner* — Vu Le
(74) *Attorney, Agent, or Firm* — William Park & Associates Patent Ltd.

(57) ABSTRACT

A data transmission circuit includes a read data transmission unit configured to, when a read signal is asserted, detect and amplify a voltage level of a first data line, transmit an amplified voltage level to a second data line, and substantially prevent a voltage level of the second data line from being amplified to be substantially equal to or more than a preset voltage level, and a write data transmission unit configured to transmit the voltage level of the second data line to the first data line when a write signal is asserted.

16 Claims, 1 Drawing Sheet

DATA TRANSMISSION CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2011-0107636, filed on Oct. 20, 2011, in the Korean Intellectual Property Office, which is incorporated by reference in its entirety.

BACKGROUND

1. Technical Field

The present invention relates to a semiconductor apparatus, and more particularly, to a data transmission circuit.

2. Related Art

A semiconductor memory apparatus stores input data and outputs stored data stored.

FIG. 1 is a diagram illustrating a general semiconductor memory apparatus that includes a data storage area 10, a data transmission circuit 20, and a data input/output circuit 30.

The data storage area 10 stores data received through first and second data lines S_Line and S_LineB, and outputs the stored data through the first and second data lines S_Line and S_LineB.

The data transmission circuit 20 transmits the data, which is received through the first and second data lines S_Line and S_LineB, to third and fourth data lines L_Line and L_LineB in a read operation. The data transmission circuit 20 transmits data, which is received through the third and fourth data lines L_Line and L_LineB, to the first and second data lines S_Line and S_LineB in a write operation.

The data input/output circuit 30 transmits data Data_in received from an exterior device to the third and fourth data lines L_Line and L_LineB, and outputs data Data_out received through the third and fourth data lines L_Line and L_LineB to an exterior device.

The data output from the data storage area 10, that is, the voltage difference between the first and second data lines S_Line and S_LineB, is detected and amplified by the data transmission circuit 20 and is output through the third and fourth data lines L_Line and L_LineB. The data input/output circuit 30 then transmits the data on the third and fourth data lines L_Line and L_LineB to an exterior device on the Data_out line. The data input/output circuit 30 may also receive data from an exterior device via the Data_in line, and transmits the data on the third and fourth data lines L_Line and L_LineB to the data transmission circuit 20. The data transmission circuit 20 transmits the data received on the third and fourth data lines L_Line and L_LineB to the data storage area 10 via the first and second data lines S_Line and S_LineB.

In general, the data transmission circuit 20 is arranged adjacent to the data storage area 10 as compared with the data input/output circuit 30. Therefore, the lengths of the first and second data lines S_Line and S_LineB may be shorter than the lengths of the third and fourth data lines L_Line and L_LineB. In other words, the loading of the first and second data lines S_Line and S_LineB is smaller than the loading of the third and fourth data lines L_Line and L_LineB.

The data transmission circuit 20 transmits data to the first and second data lines S_Line and S_LineB in the write operation, and to the third and fourth data lines L_Line and L_LineB in the read operation. The data transmission circuit 20 detects and amplifies the voltage level difference between the first and second data lines S_Line and S_LineB, and transmits the amplified voltage difference to the third and fourth data lines L_Line and L_LineB in the read operation.

The data transmission circuit 20 detects and amplifies the voltage difference between the first and second data lines S_Line and S_LineB during the read operation. Therefore, the data transmission circuit 20 performs the detection and amplification operation in the read operation even when the voltage level difference between the third and fourth data lines L_Line and L_LineB is substantially equal to or more than a desired level.

SUMMARY

A data transmission circuit and a semiconductor apparatus using the same capable of reducing current consumption are described herein.

One embodiment of the invention discloses a data transmission circuit comprising a read data transmission unit configured to, when a read signal is asserted, detect and amplify a voltage level of a first data line, transmit an amplified voltage level to a second data line, and substantially prevent a voltage level of the second data line from being amplified to be substantially equal to or more than a preset voltage level; and a write data transmission unit configured to transmit the voltage level of the second data line to the first data line when a write signal is asserted.

Another embodiment of the invention discloses a data transmission circuit comprising a read data transmission unit configured to detect and amplify a voltage level difference of a first data line pair in a read operation, transmit an amplified voltage level difference to a second data line pair, and substantially prevent a voltage level difference of the second data line from being amplified to be substantially equal to or more than a preset voltage level difference; and a write data transmission unit configured to transmit the voltage level difference of the second data line pair to the first data line pair in a write operation.

Another embodiment of the invention discloses a data transmission circuit comprising a read data transmission unit configured to change a voltage level of a second data line, which is precharged at a precharge voltage, in response to a voltage level of a first data line in a read operation, and perform control such that a voltage level variation of the second data line is substantially equal to or less than a preset voltage level variation.

Another embodiment of the invention discloses a data transmission circuit comprising a detection amplification section configured to change a voltage level of a second line in response to a voltage level of a first line when a signal is transmitted from the first line with small loading to the second line with large loading; and an amplification restriction section configured to separate the detection amplification section from the second line when the voltage level of the second line is beyond a preset voltage range.

BRIEF DESCRIPTION OF THE DRAWINGS

Features, aspects, and embodiments are described in conjunction with the attached drawings, in which.

DETAILED DESCRIPTION

A data transmission circuit and a semiconductor apparatus using the same according to embodiments of the present invention will be described in detail with reference to the accompanying drawings.

Figure 2:
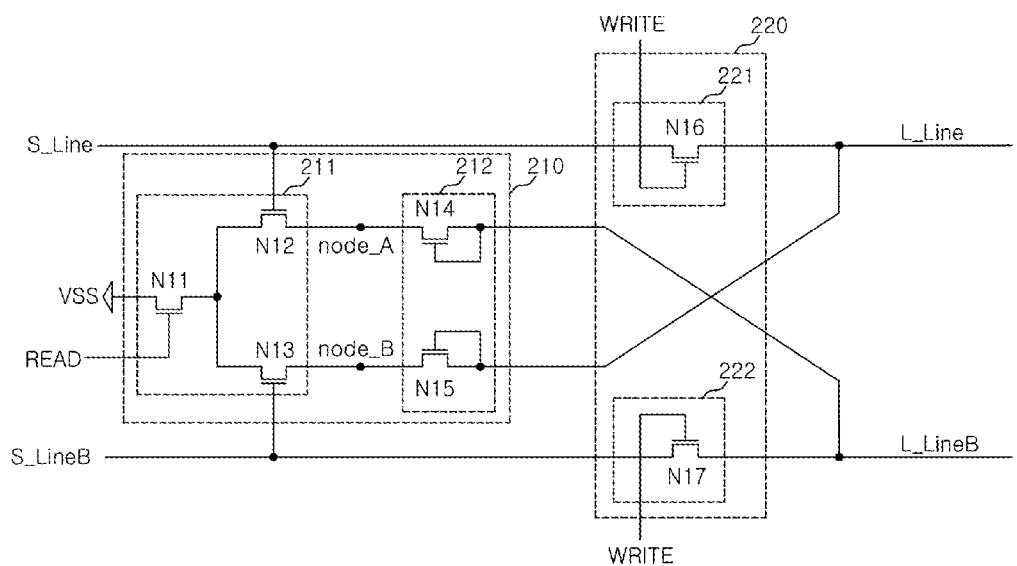
FIG. 2 is a configuration diagram of a data transmission circuit of a semiconductor memory apparatus according to an embodiment.

In a data transmission circuit 200 and a semiconductor apparatus using the same according to an embodiment, the data transmission circuit 200 includes a read data transmission unit 210 and a write data transmission unit 220 as illustrated in FIG. 2.

In a read operation, that is, when a read signal READ is asserted, the read data transmission unit 210 detects and amplifies the voltage levels of first data lines S_Line and S_LineB, and transmits the amplified voltage levels to second data lines L_Line and L_LineB while keeping the transmission voltage within preset voltage levels. The read data transmission unit 210 detects and amplifies the voltage level difference of the first data line pair S_Line and S_LineB, and transmits the amplified voltage level difference to the second data line pair L_Line and L_LineB. Furthermore, the read data transmission unit 210 substantially prevents the voltage level difference of the second data line pair L_Line and L_LineB from being amplified to be substantially equal to or more than a preset voltage level difference.

In a write operation, that is, when a write signal WRITE is asserted, the write data transmission unit 220 transmits the voltage levels of the second data lines L_Line and L_LineB to the first data lines S_Line and S_LineB. Since the length of the first data line pair S_Line and S_LineB is shorter than the length of the second data line pair L_Line and L_LineB, the loading of the first data line pair S_Line and S_LineB is smaller than the loading of the second data line pair L_Line and L_LineB. Accordingly, the write data transmission unit 220 may be configured as a transmission gate.

The read data transmission unit 210 includes a detection amplification section 211 and an amplification restriction section 212.

The detection amplification section 211 is configured to detect and amplify the voltage levels of the first data lines S_Line and S_LineB during a read operation and transmit the amplified voltage levels to the second data lines L_Line and L_LineB. In further detail, the detection amplification section 211 determines the voltage levels of first and second connection nodes node_A and node_B in response to the voltage levels of the first data lines S_Line and S_LineB during the read operation. For example, the detection amplification section 211 reduces the voltage levels of the connection nodes node_A or node_B as the voltage levels of the first data lines S_Line or S_LineB, respectively, is increased during the read operation.

The detection amplification section 211 illustrated in FIG. 2 detects and amplifies the voltage difference of the first data line pair S_Line and S_LineB during the read operation, and transmits the amplified voltage difference to the first and second connection nodes node_A and node_B. For example, the detection amplification section 211 reduces the voltage level of the first connection node node_A as the voltage level of the first data line S_Line is increased. Similarly, the detection amplification section 211 reduces the voltage level of the second connection node node_B as the voltage level of the first data line bar S_LineB is increased.

The detection amplification section 211 includes first to third transistors N11 to N13. The first transistor N11 has a gate to which the read signal READ is input, and a source coupled to a ground terminal VSS. The second transistor N12 has a gate coupled to the first data line S_Line, a drain coupled to the first connection node node_A, and a source coupled to the drain of the first transistor N11. The third transistor N13 has a gate coupled to the first data line bar S_LineB, a drain coupled to the second connection node node_B, and a source coupled to the drain of the first transistor N11.

The amplification restriction section 212 connects the connection nodes node_A and node_B to the second data lines L_Line and L_LineB, and isolates the second data lines L_Line and L_LineB from the connection nodes node_A and node_B when the voltage levels of the second data lines L_Line and L_LineB are substantially beyond preset voltage levels. For example, when the voltage level difference of the second data line pair L_Line and L_LineB is substantially equal to or more than the preset voltage level difference, the amplification restriction section 212 isolates the second data line pair L_Line and L_LineB from the first and second connection nodes node_A and node_B.

The amplification restriction section 212 illustrated in FIG. 2 includes fourth and fifth transistors N14 and N15. The fourth transistor N14 has a drain coupled to the connection node_A, a source coupled to the second data line bar L_LineB, and a gate coupled to the second data line bar L_LineB. The fifth transistor N15 has a drain coupled to the connection node_B, a source coupled to the second data line L_Line, and a gate coupled to the second data line L_Line. As described above, the amplification restriction section 212 includes the diode-type transistors N14 and N15.

The write data transmission unit 220 includes first and second transmission sections 221 and 222.

The first transmission section 221 is configured to connect the first data line S_Line to the second data line L_Line during the write operation.

The first transmission section 221 includes a sixth transistor N16. The sixth transistor N16 has a gate to which the write signal WRITE is input, a drain coupled to the first data line S_Line, and a source coupled to the second data line L_Line.

The second transmission section 222 connects the first data line bar S_LineB to the second data line bar L_LineB during the write operation.

The second transmission section 222 includes a seventh transistor N17. The seventh transistor N17 has a gate to which the write signal WRITE is input, a drain coupled to the first data line bar S_LineB, and a source coupled to the second data line bar L_LineB.

The operations of the data transmission circuit having the above configuration and the semiconductor apparatus using the same according to embodiments of the invention will be described below.

Figure 1:
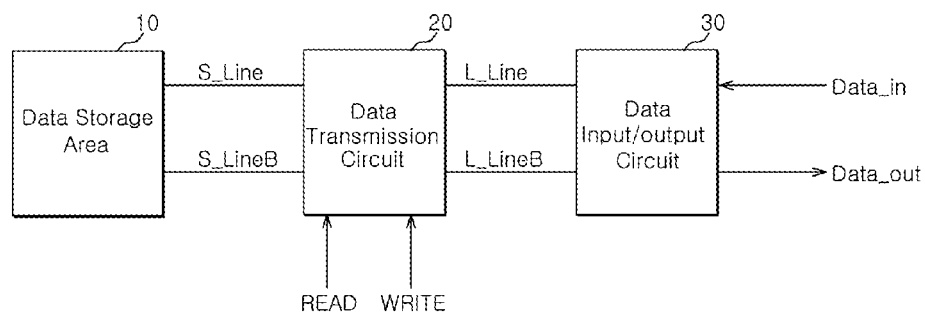
FIG. 1 is a configuration diagram of a general semiconductor memory apparatus.

The data transmission circuit 200 according to an embodiment of the invention may be substituted for the data transmission circuit 20 illustrated in FIG. 1.

The data transmission circuit 200 according to the embodiment may be arranged adjacent to the data storage area 10 as compared with the data input/output circuit 30. Therefore, the lengths of the second data line L_Line and the second data line bar L_LineB are longer than the lengths of the first data line S_Line and the first data line bar S_LineB. Thus, the loading of the first data line S_Line and the first data line bar S_LineB is smaller than the loading of the second data line L_Line and the second data line bar L_LineB.

In the write operation, data Data_in is received by the data input/output circuit 30, which then transmits the received data to the data transmission circuit 200 via the second data line L_Line and the second data line bar L_LineB.

Referring to FIGS. 1 and 2, during the write operation, the write data transmission unit 220 connects the first data line S_Line to the second data line L_Line through the sixth transistor N16, and connects the first data line bar S_LineB to the second data line bar L_LineB through the seventh transistor N17. In the write operation, data is transmitted from a large loading side (the second data line L_Line and the second data line bar L_LineB) to a small loading side (the first data line S_Line and the first data line bar S_LineB). Thus, in the write operation of the semiconductor memory apparatus, transmission functionality of the write data transmission unit 220 may be enough without having to perform amplification.

Data transmitted through the data transmission circuit 200 via the first data line S_Line and the first data line bar S_LineB is stored in the data storage area 10.

Referring to FIGS. 1 and 2, in the read operation, the data stored in the data storage area 10 is transmitted to the data transmission circuit 200 through the first data line S_Line and the first data line bar S_LineB.

In a read operation, the data transmission circuit 200 detects and amplifies data received from the data storage area 10, and transmits the amplified voltage level difference to the second data line L_Line and the second data line bar L_LineB. When data is transmitted from the small loading side (S_Line and S_LineB) to the large loading side (L_Line and L_LineB), the data transmission circuit 200 detects and amplifies data for normal data transmission.

In further detail, the read data transmission unit 210 of the data transmission circuit 200 includes the detection amplification section 211 and the amplification restriction section 212.

The detection amplification section 211 reduces the voltage level of the first connection node node_A in response to the voltage level of the first data line S_Line. Furthermore, the detection amplification section 211 reduces the voltage level of the connection node node_B in response to the voltage level of the first data line bar S_LineB. For example, the detection amplification section 211 reduces the voltage level of the first connection node node_A as the voltage level of the first data line S_Line is increased. Furthermore, the detection amplification section 211 reduces the voltage level of the connection node node_B as the voltage level of the first data line bar S_LineB is increased.

The amplification restriction section 212 connects the first connection node node_A to the second data line bar L_LineB, and isolates the first connection node node_A from the second data line bar L_LineB when the voltage level of the second data line bar L_LineB is substantially equal to or less than the preset voltage level. Furthermore, the amplification restriction section 212 connects the second connection node node_B to the second data line L_Line, and isolates the second connection node node_B from the second data line L_Line when the voltage level of the second data line L_Line is substantially equal to or less than the preset voltage level. Thus, the first and second connection nodes node_A and node_B are respectively isolated from the second data line L_LineB and the second data line bar L_Line, so that the voltage levels of the second data line L_Line and the second data line bar L_LineB are not reduced beyond a desired level, resulting in the reduction of current consumption in the read operation.

In brief, if the voltage level difference between the second data line L_Line and the second data line bar L_LineB is substantially equal to or more than the preset voltage level difference, that is, a voltage level variation, the amplification restriction section 212 isolates the second data line L_Line and the second data line bar L_LineB from the first and second connection nodes node_A and node_B, respectively. Thus, the amplification restriction section 212 performs control such that the voltage level difference between the second data line L_Line and the second data line bar L_LineB is substantially equal to or less than the preset voltage level difference, that is, the voltage level variation. The second data line L_Line and the second data line bar L_LineB may be precharged to a specific level before the read operation or the write operation.

The data transmission circuit 200 according to the embodiment may be used in a semiconductor memory apparatus, or all circuits that transmit a signal.

For example, in a semiconductor apparatus in which lengths between lines are different from each other, when a signal is transmitted from a line with small loading to a line with large loading, the data transmission circuit described may be used.

Furthermore, the data transmission circuit according to an embodiment reduces the voltage levels of the second data line L_Line and the second data line bar L_LineB, which are precharge voltage levels, in response to the voltage levels of the first data line S_Line and the first data line bar S_LineB, and performs control such that the voltage levels of the second data line L_Line and the second data line bar L_LineB are prevented from being substantially equal to or less than the preset voltage level.

It is apparent to those skilled in the art that it is possible to increase the voltage levels of the second data line L_Line and the second data line bar L_LineB, which are the precharge voltage levels, in response to the voltage levels of the first data line S_Line and the first data line bar S_LineB, and perform control such that the voltage levels of the second data line L_Line and the second data line bar L_LineB are prevented from being substantially equal to or more than the preset voltage level.

While certain embodiments have been described above, it will be understood to those skilled in the art that the embodiments described are by way of example only. Accordingly, the data transmission circuit and the semiconductor apparatus using the same described herein should not be limited based on the described embodiments. Rather, the data transmission circuit and the semiconductor apparatus using the same described herein should only be limited in light of the claims that follow when taken in conjunction with the above description and accompanying drawings.

What is claimed is:

1. A data transmission circuit comprising:
   a read data transmission unit configured to, when a read signal is asserted, detect and amplify a voltage level of a first data line, transmit an amplified voltage level to a second data line, and substantially prevent a voltage level of the second data line from being amplified to be substantially equal to or more than a preset voltage level; and
   a write data transmission unit configured to transmit the voltage level of the second data line to the first data line when a write signal is asserted.

2. The data transmission circuit according to claim 1, wherein the read data transmission unit comprises:
   a detection amplification section configured to detect and amplify the voltage level of the first data line during an activation period of the read signal, and transmit an amplified voltage level to the second data line; and
   an amplification restriction section configured to isolate the detection amplification section from the second data line when the voltage level of the second data line is substantially within preset voltage levels.

3. The data transmission circuit according to claim 2, wherein the detection amplification section is configured to determine a voltage level of a connection node in response to the voltage level of the first data line when the read signal is asserted.

4. The data transmission circuit according to claim 3, wherein the amplification restriction section is configured to connect the second data line to the connection node, and isolate the second data line from the connection node when the voltage level of the second data line is substantially within the preset voltage levels.

5. The data transmission circuit according to claim 4, wherein the amplification restriction section comprises:
   a transistor having a drain coupled to the detection amplification section, a source coupled to the second data line, and a gate coupled to the second data line.

6. A data transmission circuit comprising:
   a read data transmission unit configured to detect and amplify a voltage level difference of a first data line pair in a read operation, transmit an amplified voltage level difference to a second data line pair, and substantially prevent a voltage level difference of the second data line from being amplified to be substantially equal to or more than a preset voltage level difference; and
   a write data transmission unit configured to transmit the voltage level difference of the second data line pair to the first data line pair in a write operation.

7. The data transmission circuit according to claim 6, wherein a length of the first data line pair is shorter than a length of the second data line pair.

8. The data transmission circuit according to claim 6, wherein the read data transmission unit comprises:
   a detection amplification section configured to detect and amplify the voltage level difference of the first data line pair during an activation period of a read signal, and transmit an amplified voltage level difference to connection nodes; and
   an amplification restriction section configured to separate the connection nodes from the second data line pair when the voltage level difference of the second data line pair is substantially equal to or more than the preset voltage level difference.

9. The data transmission circuit according to claim 8, wherein the amplification restriction section comprises:
   a transistor having a drain coupled to the detection amplification section, a source coupled to the second data line, and a gate coupled to the second data line.

10. A data transmission circuit comprising:
    a read data transmission unit configured to change a voltage level of a second data line, which is precharged at a precharge voltage, in response to a voltage level of a first data line in a read operation, and perform control such that a voltage level variation of the second data line is substantially equal to or less than a preset voltage level variation.

11. The data transmission circuit according to claim 10, wherein the read data transmission unit comprises:
    a detection amplification section configured to detect and amplify the voltage level of the first data line when a read signal is asserted, and change a voltage level of a connection node; and
    an amplification restriction section configured to connect the connection node to the second data line when the voltage level of the second data line is substantially equal to or less than the preset voltage level variation, and isolate the connection node from the second data line when the voltage level of the second data line is substantially equal to or more than the preset voltage level variation.

12. The data transmission circuit according to claim 11, wherein the amplification restriction section comprises:
    a diode-type transistor coupled between the connection node and the second data line.

13. A semiconductor apparatus comprising:
    a detection amplification section configured to change a voltage level of a second line in response to a voltage level of a first line when a signal is transmitted from the first line with small loading to the second line with large loading; and
    an amplification restriction section configured to separate the detection amplification section from the second line when the voltage level of the second line is beyond a preset voltage range.

14. The semiconductor apparatus according to claim 13, wherein the detection amplification section is configured to change a voltage level of a connection node in response to the voltage level of the first line.

15. The semiconductor apparatus according to claim 14, wherein the amplification restriction section is configured to isolate the connection node from the second line when the voltage level of the second line is beyond the preset voltage range.

16. The semiconductor apparatus according to claim 15, wherein the amplification restriction section comprises:
    a transistor having a drain coupled to the connection node, a source coupled to the second line, and a gate coupled to the second line.

* * * * *